(12) United States Patent
Arakane et al.

(10) Patent No.: US 11,658,012 B2
(45) Date of Patent: May 23, 2023

(54) CONTROL METHOD AND PLASMA PROCESSING APPARATUS

(71) Applicant: Tokyo Electron Limited, Tokyo (JP)

(72) Inventors: Toshiyuki Arakane, Miyagi (JP); Tetsu Tsunamoto, Miyagi (JP); Masanori Sato, Miyagi (JP); Yoshinori Osaki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 192 days.

(21) Appl. No.: 17/118,987

(22) Filed: Dec. 11, 2020

(65) Prior Publication Data
US 2021/0183625 A1 Jun. 17, 2021

(30) Foreign Application Priority Data
Dec. 12, 2019 (JP) .............................. JP2019-224851

(51) Int. Cl.
*H01J 37/32* (2006.01)

(52) U.S. Cl.
CPC .. *H01J 37/32449* (2013.01); *H01J 37/32082* (2013.01); *H01J 37/32577* (2013.01); *H01J 2237/24571* (2013.01); *H01J 2237/334* (2013.01)

(58) Field of Classification Search
CPC ........... H01J 37/32082; H01J 37/32449; H01J 37/32577; H01J 37/32724; H01J 37/32981; H01J 37/32697; H01J 37/32862
See application file for complete search history.

(56) References Cited

U.S. PATENT DOCUMENTS

| | | | |
|---|---|---|---|
| 7,408,760 B2 * | 8/2008 | Tanimoto | G03F 7/2059 361/234 |
| 2014/0083977 A1 * | 3/2014 | Ui | H01J 37/3211 156/345.55 |
| 2015/0303092 A1 * | 10/2015 | Kawabata | G01R 19/25 361/234 |
| 2017/0084432 A1 * | 3/2017 | Valcore, Jr. | H01J 37/32146 |
| 2018/0005802 A1 * | 1/2018 | Chen | H01J 37/32678 |
| 2018/0286731 A1 * | 10/2018 | Hamaguchi | H01L 21/6831 |
| 2019/0066982 A1 * | 2/2019 | Sato | H01L 21/67253 |

FOREIGN PATENT DOCUMENTS

JP 2013-149935 A 8/2013

* cited by examiner

*Primary Examiner* — Tung X Le
(74) *Attorney, Agent, or Firm* — Nath, Goldberg & Meyer; Jerald L. Meyer; Tanya E. Harkins

(57) ABSTRACT

A control method includes: (a) connecting a power supply to an electrode of an electrostatic chuck inside a chamber and applying a voltage from the power supply to the electrode; (b) after (a), switching a connection between the electrode and the power supply to a non-connection state; (c) after (b), supplying a gas into the chamber to generate plasma; and (d) measuring a potential of the electrode during (c).

8 Claims, 9 Drawing Sheets

A : ground electrode
B : high-frequency electrode
$C_B$ : blocking capacitor

Potential of electrode: $V_0$
The charge amount: $Q_{sur}$

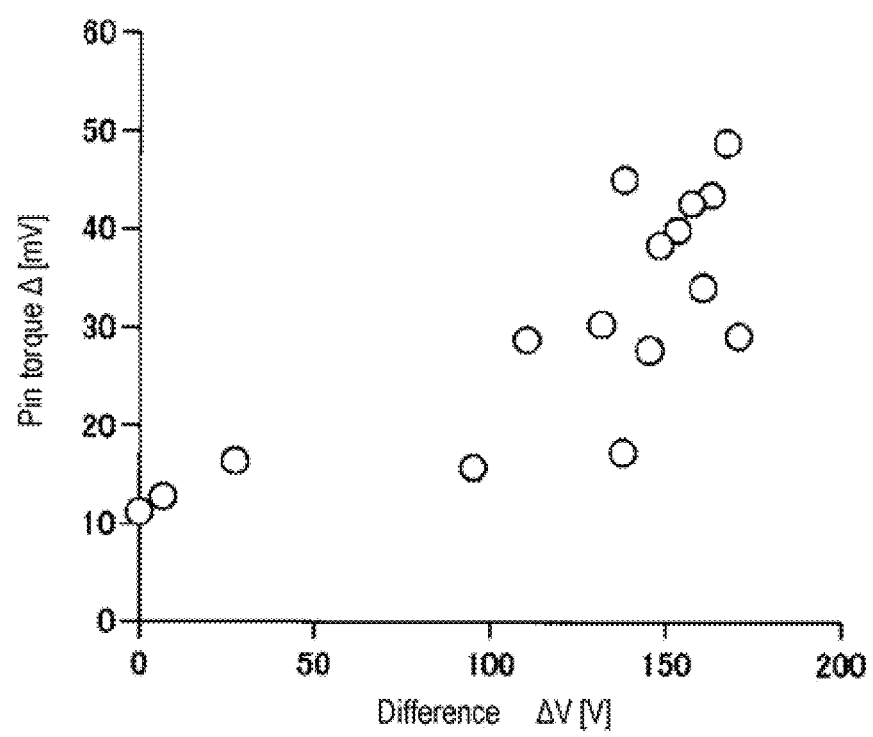

CONTROL METHOD AND PLASMA PROCESSING APPARATUS

CROSS-REFERENCE TO RELATED APPLICATION

This application is based upon and claims the benefit of priority from Japanese Patent Application No. 2019-224851, filed on Dec. 12, 2019, the entire contents of which are incorporated herein by reference.

TECHNICAL FIELD

The present disclosure relates to a control method and a plasma processing apparatus.

BACKGROUND

Patent Document 1 discloses a technique in which, after processing a substrate electrostatically adsorbed on an electrostatic chuck, a predetermined HV voltage is applied to an electrode of the electrostatic chuck from a power supply to eliminate electric charges between the electrostatic chuck and the substrate, and after that, lifter pins are raised to detach the substrate from the electrostatic chuck and carry the substrate to the outside.

If electric charges accumulate on the surface of the electrostatic chuck during the substrate process, residual adsorption occurs between the electrostatic chuck and the substrate during the elimination due to the amount of accumulated electric charges (hereinafter also referred to as a "residual electric charge amount"), which makes it difficult to detach the substrate from the electrostatic chuck. If the lifter pins are raised during the residual adsorption, the substrate may be cracked.

PRIOR ART DOCUMENTS

Patent Documents

Patent Document 1: Japanese laid-open publication No. 2013-149935

SUMMARY

According to one embodiment of the present disclosure, a control method includes: (a) connecting a power supply to an electrode of an electrostatic chuck inside a chamber and applying a voltage from the power supply to the electrode; (b) after (a), switching a connection between the electrode and the power supply to a non-connection state; (c) after (b), supplying a gas into the chamber to generate plasma; and (d) measuring a potential of the electrode during (c).

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 8 is a view showing an example of the correlation between a difference in potential drop of the electrode potential from the ground and a pin torque according to the embodiment.

DETAILED DESCRIPTION

Figure 1A:
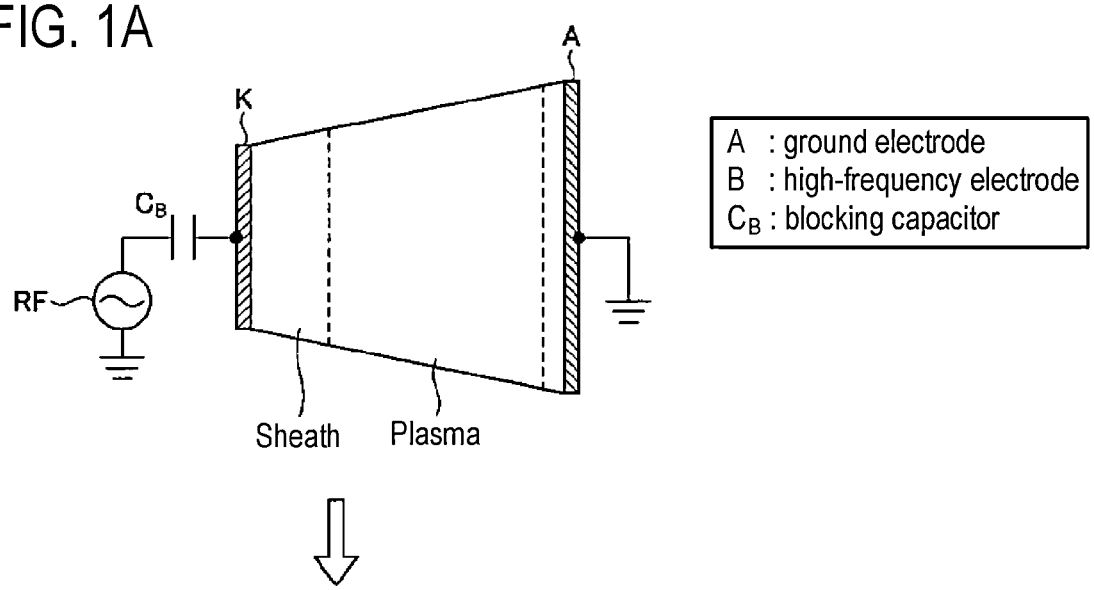
FIGS. 1A and 1B are views for explaining a self-bias voltage $V_{dc}$.

Reference will now be made in detail to various embodiments, examples of which are illustrated in the accompanying drawings. Throughout the specification and the drawings, the substantially same elements and parts are denoted by the same reference numerals, and explanation thereof will be not repeated. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Self-Bias Voltage]

Figure 1B:
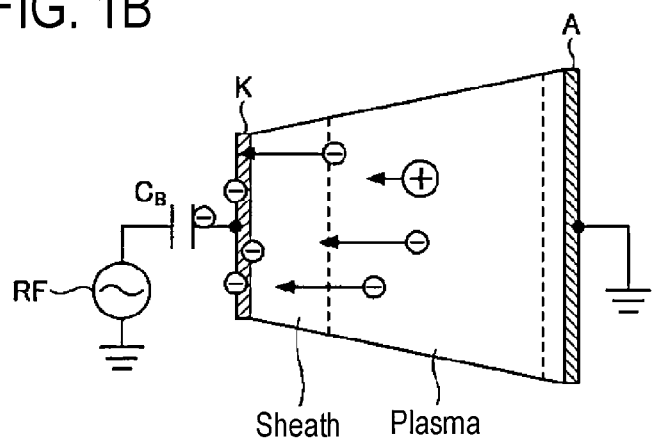

First, a direct current self-bias voltage of plasma (hereinafter referred to as a "self-bias voltage $V_{dc}$") will be described with reference to FIGS. 1A and 1B. FIGS. 1A and 1B are views for explaining the self-bias voltage $V_{dc}$.

FIG. 1A schematically shows a portion of a counter electrode in which an electrode A and an electrode K are arranged so as to face each other. The electrode A is a grounded electrode that is grounded, and the electrode K is a high-frequency electrode connected to a high-frequency power supply (RF power supply) via a blocking capacitor $C_B$. The area of the electrode K is smaller than that of the electrode A.

High-frequency RF power is applied to the electrode K to ionize and dissociate a gas to generate plasma. Since the high-frequency RF in which the positive and negative of the sine curve are symmetrical is applied to the electrode K, the potential of the electrode K becomes zero in total. Electrons and positive ions are generated from the generated plasma, and as shown in FIG. 1B, the electrons flow into the electrode K when the electrode K has a positive potential with respect to the plasma, and the positive ions flow into the electrode K when the electrode K has a negative potential with respect to the plasma.

At this time, since the electrons have a small mass, they can follow a high-speed potential fluctuation of the electrode K. As a result, the electrons flow into the electrode K. On the other hand, since the positive ions have a large mass, they cannot follow the high-speed potential fluctuation of the electrode K and move in an average electric field according to the law of inertia. Therefore, the amount of ions flowing into the electrode K is constant and very small.

Since the electrode K is floating from the ground by the blocking capacitor $C_B$, the electrons flowing into the electrode K do not flow to the ground. Therefore, the electrons flow into and accumulate in the electrode K in a period (half cycle) in which the surface of the electrode K has a positive potential with respect to the plasma. However, due to the accumulated electrons, the surface of the electrode K is negatively charged to generate a negative bias with respect to the plasma. The negative bias causes the positive ions to flow into the surface of the electrode K. As a result, a sheath is formed on the surface of the electrode K.

Eventually, the surface of the electrode K will be at a positive potential with respect to the plasma for a very short time during one cycle. The DC component of the potential difference of the electrode K when a balance between the electrons flowing at that time and the positive ions constantly flowing due to the negative bias is made, is the self-bias voltage $V_{dc}$.

In an embodiment to be described below, the potential of an electrode of an electrostatic chuck when the electrode of the electrostatic chuck changes from the ground to a floating state is measured. When no residual electric charges are accumulated on the surface layer of the electrostatic chuck, the potential of the electrode of the electrostatic chuck corresponds to the self-bias voltage $V_{dc}$. On the other hand, when the residual electric charges are accumulated on the surface layer of the electrostatic chuck, the potential of the electrode of the electrostatic chuck has a value depending on the self-bias voltage $V_{dc}$ and the residual electric charge amount. This allows the residual electric charge amount accumulated on the surface layer of the electrostatic chuck to be estimated from a change in the potential of the electrode of the electrostatic chuck measured for each substrate W. Hereinafter, a plasma processing apparatus having an electrostatic chuck and a measuring device that measures the potential of an electrode of the electrostatic chuck will be described.

[Configuration of Plasma Processing Apparatus and Measuring Device]

Figure 2:
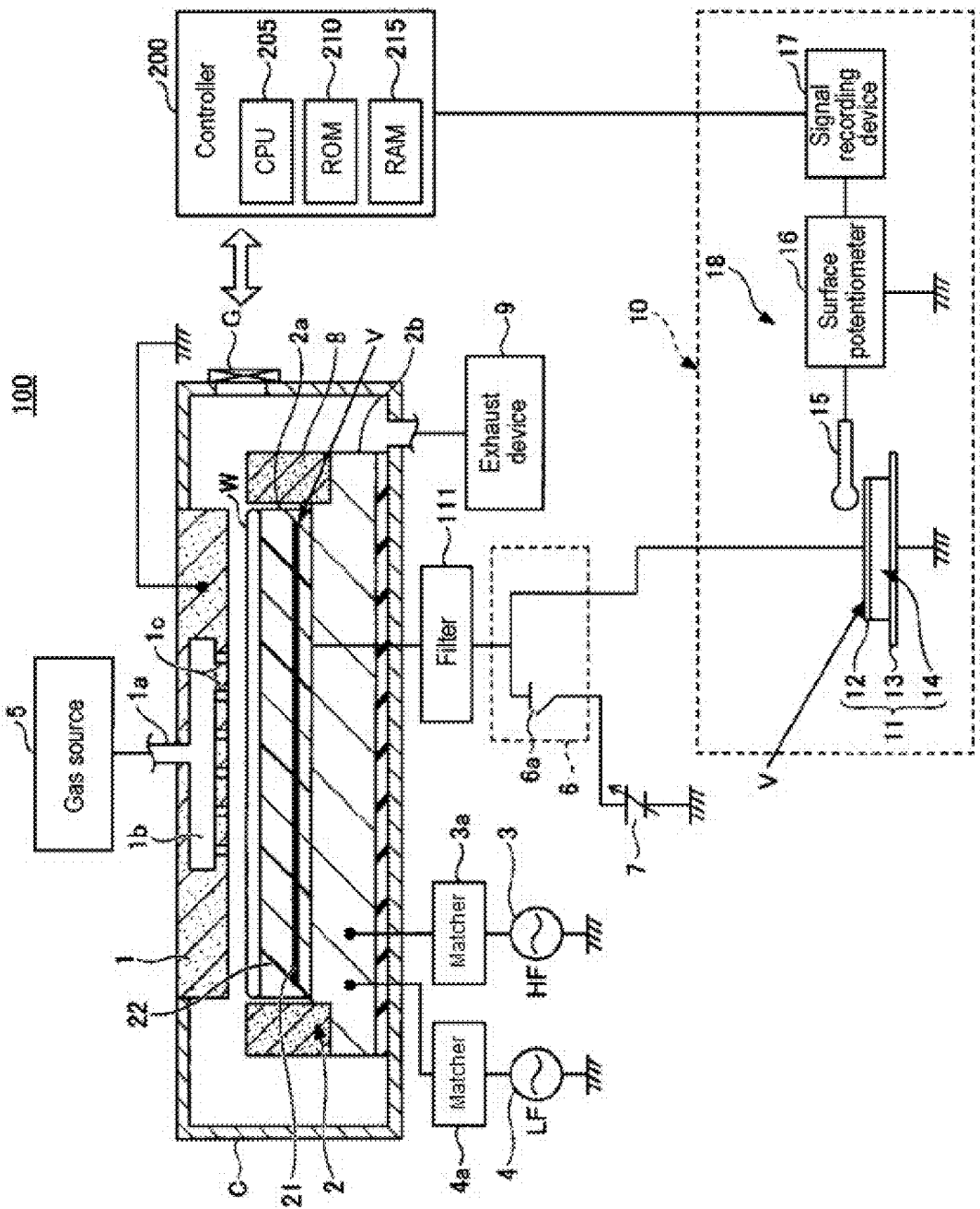
FIG. 2 is a view showing a plasma processing apparatus and a measuring device according to an embodiment.

FIG. 2 is a view showing a plasma processing apparatus 100 and a measuring device 10 according to an embodiment. The plasma processing apparatus 100 has a chamber C, a relay box 6, and a measuring device 10. The measuring device 10 measures a voltage of an electrode 21 of an electrostatic chuck 2a disposed in the chamber C. The relay box 6 switches connection/disconnection between a power supply 7 and the electrode 21. When the power supply 7 and the electrode 21 are opened (disconnected), the electrode 21 is in a floating state, and the measuring device 10 measures a voltage V between a copper circular plate 12 and a copper plate 13. The voltage V is a value corresponding to the amount of electric charges accumulated on an acrylic plate 14 sandwiched between the copper circular plate 12 and the copper plate 13, and indicates a DC component of the potential of the electrode 21 of the electrostatic chuck 2a. Thus, in the embodiment, the potential of the electrode 21 of the electrostatic chuck 2a can be measured only by providing the relay box 6 and the measuring device 10 to the plasma processing apparatus 100.

The plasma processing apparatus 100 is a capacitively-coupled parallel plate plasma processing apparatus and has a substantially cylindrical chamber C. The inner surface of the chamber C is alumite-treated (anodized). The interior of the chamber C is a processing chamber where a substrate process such as an etching process, a film forming process, or the like is performed by plasma. A stage 2 is provided inside the chamber C.

The electrostatic chuck 2a for electrostatically adsorbing the substrate W on a base 2b is provided in the stage 2. The base 2b is made of, for example, aluminum (Al), titanium (Ti), silicon carbide (SiC), or the like. The stage 2 also functions as a lower electrode.

The electrostatic chuck 2a has a structure in which the electrode 21 is provided inside a dielectric layer 22. Dot-shaped convex portions may be formed on the surface of the electrostatic chuck 2a. The electrode 21 is connected to the relay box 6 via a low pass filter 111. When a switch 6a of the relay box 6 is closed (connected) to apply a DC voltage (hereinafter also referred to as an "HV voltage") from the power supply 7 to the electrode 21, the substrate W is electrostatically adsorbed and held on the electrostatic chuck 2a by a Coulomb force.

An annular edge ring 8 is placed on the upper portion of the outer peripheral side of the electrostatic chuck 2a so as to surround the outer edge portion of the substrate W. The edge ring 8 is made of, for example, silicon, and functions to converge the plasma toward the surface of the substrate W to improve the efficiency of plasma processing.

The power of a high-frequency HF for plasma generation, which is a first frequency, is applied to the stage 2 from a first high-frequency power supply 3, and the power of a high-frequency LF for generating a bias voltage, which is a second frequency lower than the first frequency, is applied to the stage 2 from a second high-frequency power supply 4. The first high-frequency power supply 3 is electrically connected to the stage 2 via a matcher 3a. The second high-frequency power supply 4 is electrically connected to the stage 2 via a matcher 4a. The first high-frequency power supply 3 applies, for example, the power of a high-frequency HF of 40 MHz to the stage 2. The second high-frequency power supply 4 applies, for example, the power of a high-frequency LF of 13.56 MHz to the stage 2. In an embodiment, the first high-frequency power may be applied to a gas shower head 1.

The matcher 3a matches load impedance to internal (or output) impedance of the first high-frequency power supply 3. The matcher 4a matches the load impedance to internal (or output) impedance of the second high-frequency power supply 4.

The gas shower head 1 is attached so as to close an opening of the ceiling of the chamber C via a shield ring that covers the outer edge portion of the gas shower head 1. The gas shower head 1 is grounded. The gas shower head 1 may be made of silicon. The gas shower head 1 functions as a counter electrode (upper electrode) that faces the stage 2 (the lower electrode).

The gas shower head 1 is formed with a gas introducing hole 1a for introducing a gas therethrough. A diffusion chamber 1b in which the gas is diffused is provided inside the gas shower head 1. The gas output from a gas source 5 is supplied to the diffusion chamber 1b via the gas introducing hole 1a, diffused in the diffusion chamber 1b, and introduced into the chamber C through a large number of gas supply holes 1c.

An exhaust port is formed on the bottom surface of the chamber C, and the interior of the chamber C is exhausted by an exhaust device 9 connected to the exhaust port. Thus, the interior of the chamber C can be maintained at a predetermined degree of vacuum. A gate valve G is provided on the sidewall of the chamber C. The gate valve G is opened and closed when the substrate W is loaded into and unloaded from the chamber C.

When a process gas is supplied from the gas source 5 into the chamber C, and the high-frequency HF and LF powers are applied to the stage 2 from the first high-frequency power supply 3 and the second high-frequency power supply 4, respectively, plasma is generated to perform substrate process such as an etching process, a cleaning process, a film forming process, or the like on the substrate W. Hereinafter, the etching process will be described as an example of the substrate process.

After the plasma processing, a given HV voltage is applied from the power supply 7 to the electrode 21 to eliminate electric charges on the substrate W. Then, lifter pins (not shown) are raised to come into contact with the back surface of the substrate W and lift the substrate W, whereby the substrate W is separated from the electrostatic chuck 2a and carried from the gate valve G to the outside of the chamber C. The "given HV voltage" applied during the elimination of the electric charges may be an HV voltage whose polarity is opposite to that of a voltage applied at the time of adsorbing the substrate W when residual electric charges are not accumulated on the surface layer of the electrostatic chuck 2a. When the residual electric charges are accumulated on the surface layer of the electrostatic chuck 2a, the "given HV voltage" is determined in consideration of an estimated residual electric charge amount to be described later.

The plasma processing apparatus 100 is provided with a controller 200 that controls the entire operation of the apparatus. The controller 200 includes a CPU (Central Processing Unit) 205, a ROM (Read Only Memory) 210, and a RAM (Random Access Memory) 215. The CPU 205 executes the etching process by executing a control program according to a recipe stored in a storage area such as the RAM 215 or the like. The recipe is set with apparatus control information for process conditions such as process time, pressure (gas exhaust), high-frequency power and voltage, various gas flow rates, internal temperature of the chamber (temperature of the substrate W, temperature of the electrostatic chuck temperature, etc.), temperature of refrigerant, and the like.

In addition, the controller 200 switches the switch 6a of the relay box 6 at a predetermined timing to control connection/disconnection between the electrode 21 and the power supply 7. The voltage V measured by the measuring device 10 is transmitted to the controller 200. The controller 200 stores the measured voltage V in the RAM 215. The controller 200 calculates the amount of change in the voltage V stored in the RAM 215 between the previous time and the current time. The controller 200 estimates the residual electric charge amount of the surface layer of the electrostatic chuck 2a based on the amount of change in the voltage V between the previous time and the current time.

A program for executing these operations and a recipe indicating the process conditions may be stored in a hard disk or a semiconductor memory. The recipe may be set and read at a predetermined position in a state where it is accommodated in a portable non-transitory computer-readable storage medium such as a CD-ROM, a DVD, or the like.

(Configuration of Measuring Device)

Next, an example of the configuration of the measuring device 10 will be described. The measuring device 10 includes the copper circular plate 12, the copper plate 13, the acrylic plate 14, a probe 15, a surface potentiometer 16, and a signal recording device 17. The probe 15 and the surface potentiometer 16 constitute a potential measuring system 18.

FIG. 2 shows that the relay box 6 is separated from the measuring device 10 and the low pass filter 111 for the sake of convenience in description, but the measuring device 10 has the relay box 6 and the low pass filter 111. The relay box 6 switches connection/disconnection between the electrode 21 and the power supply 7. The relay box 6 switches the switch 6a of the relay box 6 from closed to opened at a timing of measuring the potential of the electrode 21 to connect the electrode 21 to the measuring device 10. A member in which the acrylic plate 14 is sandwiched between the copper circular plate 12 and the copper plate 13 is an example of a member 11 for measuring the potential of the electrode 21. The member 11 for measuring the potential of the electrode 21 is not limited to the configuration of the copper circular plate 12, the copper plate 13, and the acrylic plate 14, and can be configured by an insulated conductor.

In the potential measuring system 18, a potential generated in the member 11 for measuring the potential of the electrode 21, that is, a potential V generated in the acrylic plate 14 between the copper circular plate 12 and the copper plate 13, is measured by the surface potentiometer 16 using the probe 15 provided in non-contact with the surface of the copper circular plate 12. The potential measuring system 18 measures the potential V of the member 11 corresponding to the amount of electric charges accumulated on the member 11, thereby measuring the potential V of the electrode 21. The probe 15 may be in either contact or non-contact with the copper circular plate 12 as long as it can measure the potential V of the member 11.

When the switch 6a of the relay box 6 is switched from the state in which it is connected to the power supply 7 to the state in which it is not connected to the power supply 7, the voltage V generated in the member 11, that is, the voltage V of the electrode 21 in the floating state, can be measured.

Specifically, the copper plate 13 is grounded, and the potential measured by the surface potentiometer 16 using the probe 15 provided in non-contact with the surface of the copper circular plate 12 becomes the voltage V of the electrode 21 in the floating state. The diameter of the copper circular plate 12 may be about 100 mm, but is not limited thereto.

The voltage V measured by the surface potentiometer 16 is stored in the signal recording device 17 connected to the surface potentiometer 16. The signal recording device 17 may be a device having a memory such as a personal computer or a tablet terminal device, or a cloud computer provided on a cloud. The voltage V recorded in the signal recording device 17 is transmitted to the controller 200 in which the voltage V is used to estimate the residual electric charge amount of the surface layer of the electrostatic chuck 2a and control the HV voltage applied to the electrostatic chuck 2a at the time of elimination of the electric charges in consideration of the estimated residual electric charge amount.

The amount of electric charges accumulated on the member 11 is affected by moisture. Therefore, it is preferable that the copper circular plate 12, the copper plate 13, the acrylic plate 14, and the probe 15 be provided inside a vacuum container. This allows the voltage V to be accurately measured without being affected by a disturbance due to the environment.

[Measurement Timing of Voltage of Electrode]

Figure 3:
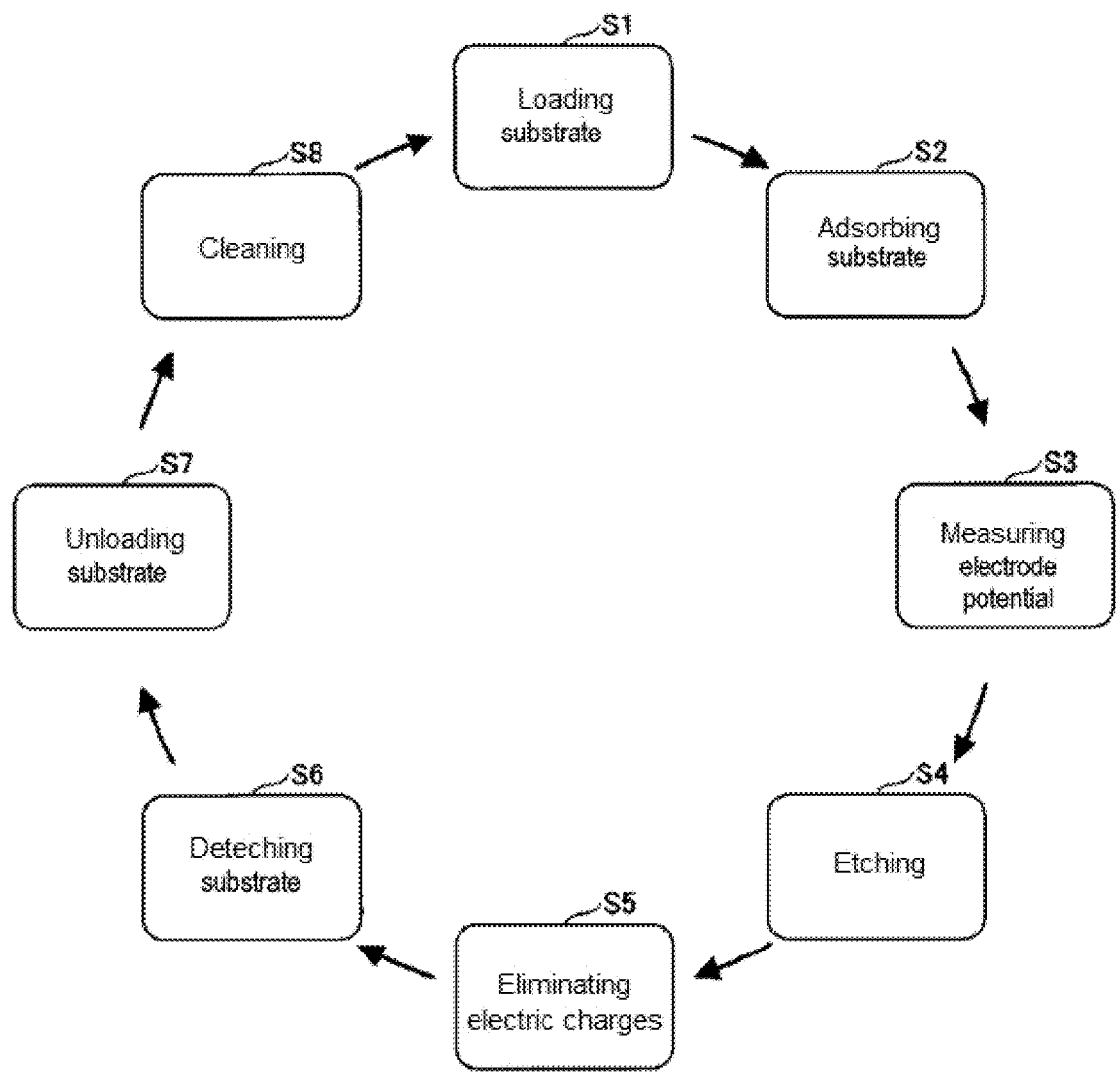
FIG. 3 is a view showing a processing cycle according to an embodiment.

Next, a measurement timing of the voltage V of the electrode 21 executed in the plasma processing apparatus 100 will be described with reference to FIG. 3 that shows a processing cycle for processing the substrate W. FIG. 3 is a view showing the processing cycle for processing the substrate W according to the embodiment.

First, the controller 200 loads the substrate W into the chamber C from the gate valve G of the plasma processing apparatus 100 (step S1). Subsequently, the controller 200 applies an HV voltage from the power supply 7 to the electrode 21 to electrostatically adsorb the substrate W on the electrostatic chuck 2a (step S2).

Subsequently, the controller 200 opens the switch 6a and measures the potential V of the electrode 21 using the measuring device 10 (step S3). In step S3, the relay box 6 measures the voltage V of the electrode 21 in the floating state by the potential measuring system 18 of the measuring device 10 in a state where the electrode 21 is disconnected from the power supply 7 by the switch 6a at a timing before executing an etching process.

Subsequently, the controller 200 applies the high-frequency power to the stage 2 to turn a gas supplied from the gas source 5 into plasma to perform the etching process on the substrate W (step S4). Subsequently, the controller 200 applies a given HV voltage to the electrode 21 to eliminate electric charges (step S5). Since the residual electric charges are not accumulated on the surface layer of the electrostatic chuck 2a in the electric charges eliminating process after a first-round substrate process is performed, the controller 200 applies, for example, an HV voltage whose polarity is opposite to that of the voltage applied when the substrate W is adsorbed. Since the residual electric charges are accumulated on the surface layer of the electrostatic chuck 2a during a cleaning process and a substrate process to be described later in the electric charges eliminating process after a second-round substrate process and subsequent processes are performed, the controller 200 determines an HV voltage in consideration of an estimated residual electric charge amount (to be described later), and applies the determined HV voltage. That is, the controller 200 measures the (current) voltage V of the member 11 using the measuring device 10, determines an HV voltage based on a variation between the previous voltage V and the current voltage V, and applies the determined HV voltage.

After the elimination, the controller 200 raises the lifter pins to detach the substrate W from the electrostatic chuck 2a (step S6), and carries the substrate W out of the gate valve G (step S7). Subsequently, the controller 200 supplies a cleaning gas and performs the cleaning process with plasma of the cleaning gas (step S8). Since the cleaning process is wafer-less dry cleaning (WLDC) performed without placing the substrate on the electrostatic chuck 2a, the surface layer of the electrostatic chuck 2a is charged with electric charges.

At this point, the processing of one substrate W is ended, and one processing cycle is completed. When the processing cycle of the next substrate W is restarted, the next substrate W is loaded (step S1), and the processes after step S1 are repeated.

[Measurement of Electrode Potential]

Figure 4:
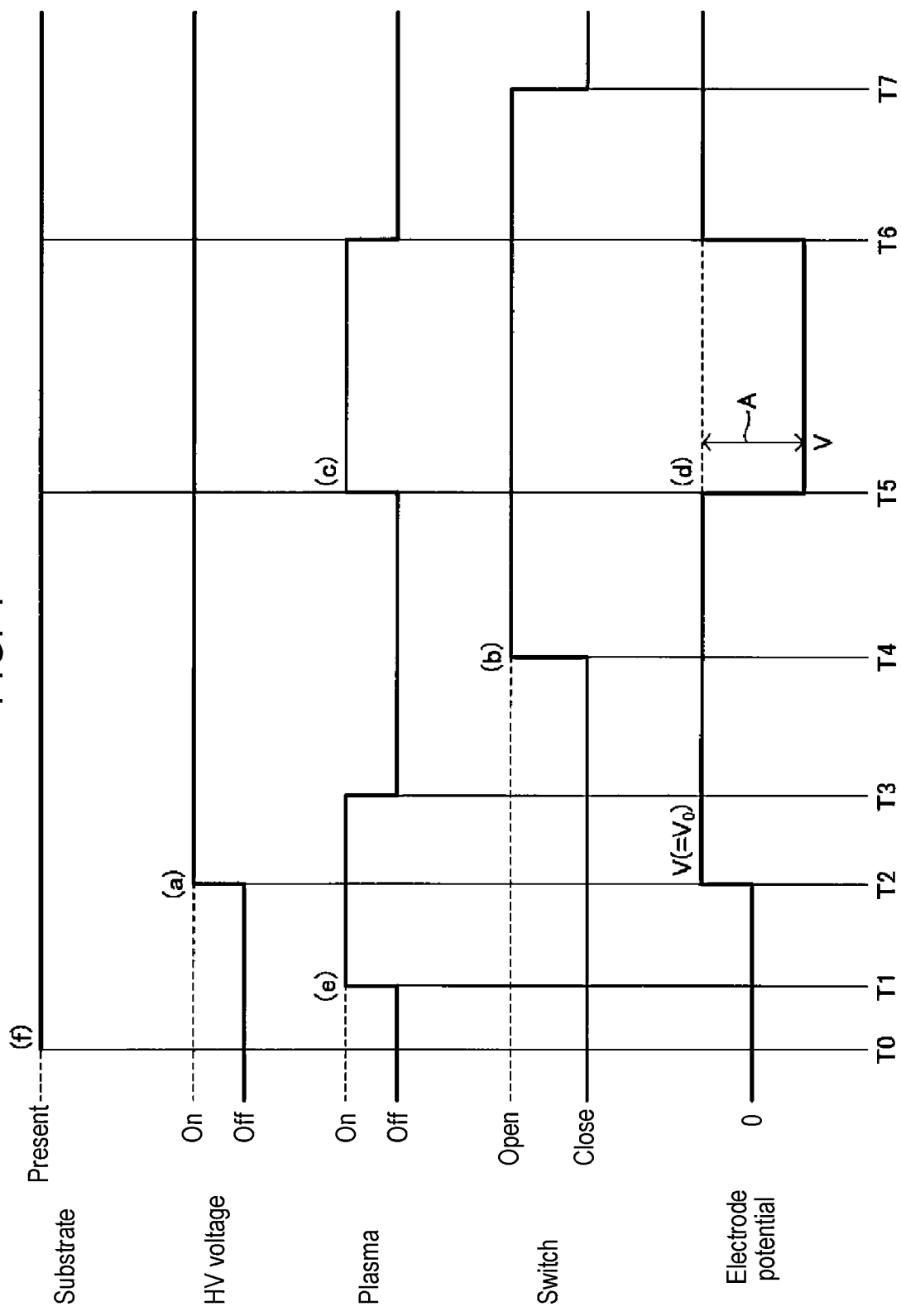
FIG. 4 is a timing chart showing a measurement sequence of electrode potential according to an embodiment.

Next, a measurement sequence of the electrode potential in step S3 will be described with reference to FIGS. 4 and, 5A to 5E. FIG. 4 is a timing chart showing a measurement sequence of the electrode potential according to an embodiment. FIGS. 5A to 5E are views for explaining a measurement sequence of the electrode potential according to the embodiment. A control method at the time of measuring the electrode potential shown in FIGS. 4, and 5A to 5E is executed by the controller 200.

At time T0 when this sequence is started, the substrate W is placed on the electrostatic chuck 2a as shown in (f), and at time T0, the switch 6a of the relay box 6 is in a closed state (connected to the power supply 7), and the electrode 21 is in a state of ground potential.

In this state, the measurement sequence of the electrode potential is executed in the order of steps (a)→(b)→(c)→(d). Although (e) is a preferable step to be executed, it is not essential. Therefore, first, the flow of processing of (a)→(b)→(c)→(d) will be described, and then the processing of (e) will be described later.

Figure 5A:
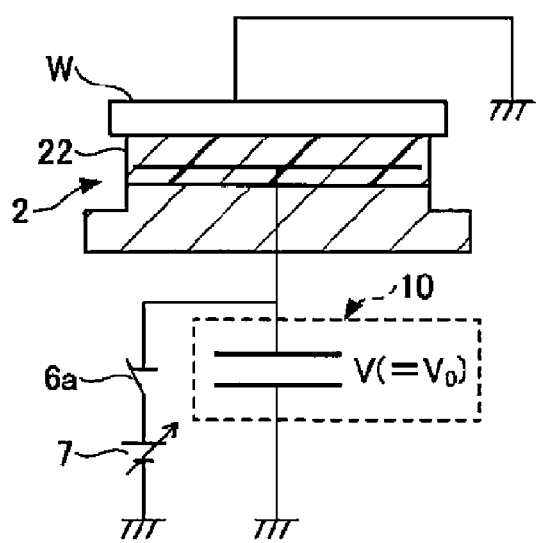
FIGS. 5A to 5E are views for explaining a measurement sequence of electrode potential according to an embodiment.

At time T2, the controller 200 starts the step (a). In the step (a), an HV voltage is applied from the power supply 7 to the electrode 21. The potential V of the electrode 21 at this time is determined by the HV voltage applied from the power supply 7, and this potential is set to V0. As shown in FIG. 5A, the HV voltage is applied from the power supply 7 to the electrode 21 in the state where the switch 6a is closed, the potential V of the electrode 21 changes from 0 to $V_0$, and the substrate W is adsorbed on the electrostatic chuck 2a.

Figure 5B:
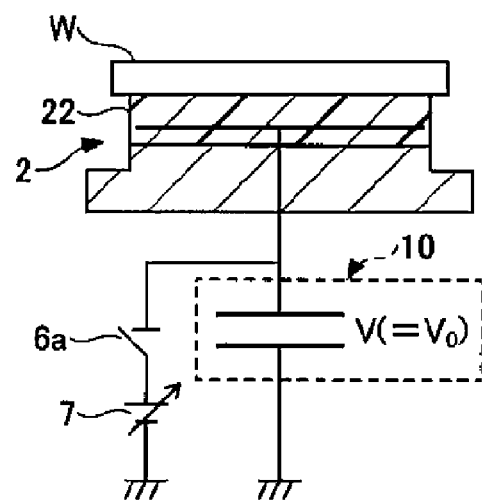

Subsequently, at time T4, the controller 200 starts the step (b). In the step (b), the switch 6a is switched to open so that the electrode 21 is brought into non-contact with the power supply 7. At this time, as shown in FIG. 5B, the electrode 21 is in a floating state. In this state, the HV voltage is not applied from the power supply 7 to the electrode 21, but the potential V of the electrode 21 is $V_0$, and the substrate W remains adsorbed on the electrostatic chuck 2a.

Figure 5C:
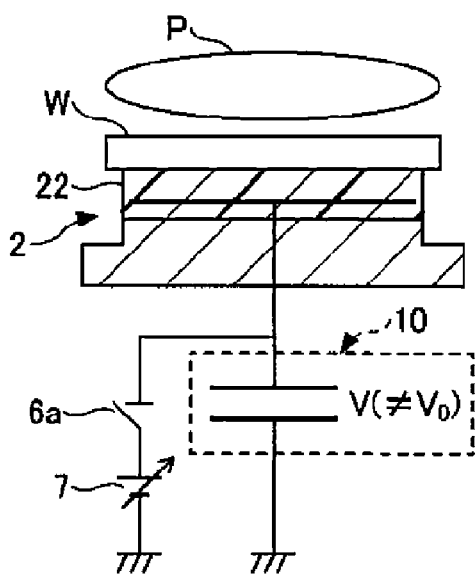

Subsequently, at time T5, the controller 200 starts the step (c). In the step (c), a gas is supplied from the gas source 5 into the chamber C. At this time, the gas is turned into plasma by the power of the high-frequency HF, as shown in FIG. 5C, and the substrate W is irradiated with the plasma P. In this case, the potential V of the electrode 21 decreases corresponding to the self-bias voltage $V_{dc}$ (potential drop indicated by A in FIG. 4). When the surface layer of the electrostatic chuck 2a is not charged, the potential drop value from the potential $V_0$ becomes a value corresponding to the self-bias voltage $V_{dc}$. On the other hand, when the surface layer of the electrostatic chuck 2a is charged, the potential drop value from the potential $V_0$ becomes a value corresponding to the self-bias voltage $V_{dc}$ and the residual electric charge amount on the surface layer of the electrostatic chuck 2a. Therefore, by measuring a change in the potential drop value when the substrate W is irradiated with the plasma P, the residual electric charge amount can be estimated based on the change in the potential drop value. For example, the controller 200 determines the HV voltage to be applied at the time of electric charges elimination in response to the change in the potential drop value or the potential V (change in the residual electric charge amount) at the previous time and the current time when the electrode 21 is in the floating state. Then, the HV voltage determined in the elimination process (step S5 in FIG. 3) is applied to the electrode 21. As a result, it is possible to perform the elimination corresponding to the amount of electric charges on the surface layer of the electrostatic chuck 2a.

The measurement of the potential drop value is performed by the potential measuring system 18 of the measuring device 10 connected to the electrode 21 in the floating state. The controller 200 measures the voltage V of the member 11 using the potential measuring system 18 (the probe 15 and the surface potentiometer 16), and records the potential drop value from the potential V (=$V_0$) of the electrode 21 or the measured potential V in the signal recording device 17.

Figure 5D:
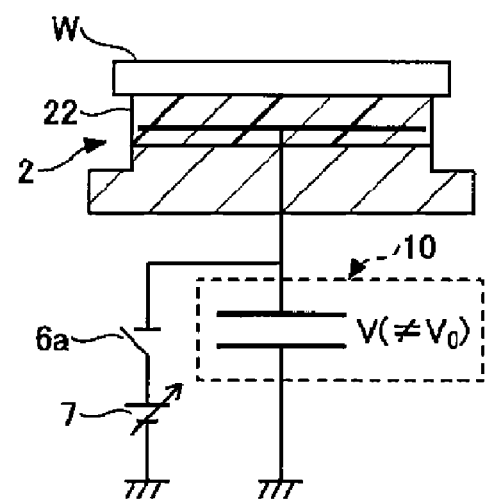

Subsequently, at time T6, the controller 200 stops the application of the gas and the power of the high-frequency HF. As a result, the steps (c) and (d) of FIG. 4 are ended, and the plasma P is extinguished as shown in FIG. 5D.

Figure 5E:
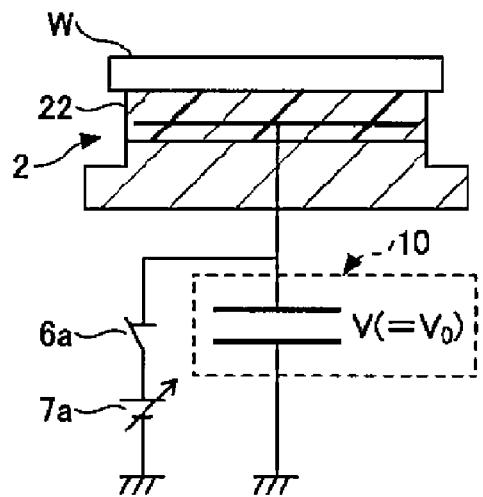

Subsequently, at time T7, the controller 200 connects the switch 6a of the relay box 6 to the power supply 7 (FIG. 5E). As a result, the sequence of measuring the potential V of the electrode 21 is ended. After time T7, the etching process by plasma is performed.

By performing the process of measuring the potential V of the electrode 21 (step S3 in FIG. 3) described above before the etching process (step S4), the controller 200 acquires a potential drop value indicating a change from the potential $V_o$ of the potential V of the electrode 21 for each wafer. By linking this potential drop value (the residual electric charge amount) with parameters (HV voltage and the like) of the elimination process and the substrate detachment process of steps S5 and S6, deterioration of the detachment characteristics in step S6 can be avoided.

[Potential V of Electrode]

In the measurement process of FIG. 3 (the step of FIG. 4D), after applying the HV voltage to the electrode of the electrostatic chuck 2a in the step of FIG. 4A, the potential V of the electrode 21 is measured during the plasma irradiation step (c) before performing the etching process of step S4 of FIG. 3. In this measurement, the potential V of the member 11 is measured by the surface potentiometer 16 with the switch 6a opened, and is set as the potential V of the electrode 21. The potential V of the member 11 is the potential $V_0$ when the switch 6a is closed.

Figure 6A:
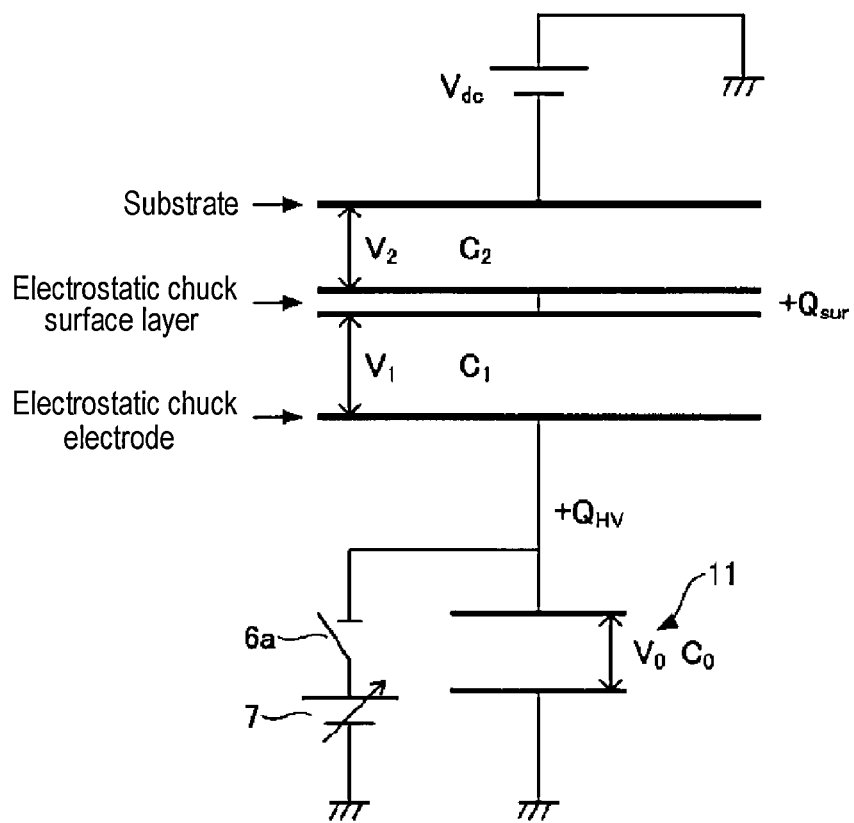
FIGS. 6A and 6B are views for explaining the state of electrode potential according to an embodiment.

The state of the potential V of the electrode 21 will be described with reference to an equivalent circuit of FIG. 6A and a relative potential diagram of the electrode 21 of FIG. 6B. FIG. 6A shows an equivalent circuit of a model of the electrode 21 and peripheral members. The model of FIG. 6A shows a path of the ground→the power supply 7, the switch 6a, and the member 11 of the measuring device 10→the electrostatic chuck 2a (the electrode 21)→the electrostatic chuck 2a (the surface layer)→the substrate→the chamber C→the ground.

The potential V of the member 11, that is, the potential V of the electrode 21, is equal to the potential V0 when the switch 6a is closed and the power supply 7 is connected to the electrode 21. As shown in FIG. 6A, when the switch 6a is opened, the electrode 21 is in a floating state. When the substrate W is irradiated with plasma in this state, a self-bias voltage $V_{dc}$ is generated, and the potential V of the electrode 21 correspondingly drops from the ground by the self-bias voltage $V_{dc}$ (potential drop). However, when the surface layer of the electrostatic chuck 2a is charged, the potential drop value depends on the electric charge amount of the surface layer of the electrostatic chuck 2a ($Q_{sur}$ in FIG. 6A) and the self-bias voltage $V_{dc}$. Since the self-bias voltage $V_{dc}$ is substantially constant, a change in the potential drop value between the voltage V measured at the previous time and the voltage V measured at the current time becomes a voltage according to the electric charge amount of the surface layer of the electrostatic chuck 2a.

As shown in FIG. 6A, it is assumed that the potential of the electrode 21 is V, the potential V of the member 11 when the switch 6a is closed (=the potential V of the electrode 21 when the electrode 21 is connected to the ground) is $V_0$, and the electrostatic capacitance of the surface potentiometer 16 is $C_0$. At this time, the potential V of the electrode 21 becomes positive $V_0$ from the ground (GND) in the example of FIG. 6B.

The potential and electrostatic capacitance between the electrode 21 and the surface layer of the electrostatic chuck 2a are assumed to be $V_1$ and $C_1$, and the potential and electrostatic capacitance between the surface layer of the electrostatic chuck 2a and the substrate W are assumed to be $V_2$ and $C_2$. As shown in FIGS. 1A and 1B, when the substrate (the lower electrode) is irradiated with plasma, the self-bias voltage $V_{dc}$ is generated. It is assumed that the initial electric charge amount of the electrostatic chuck 2a when no electric charges are accumulated on the surface layer of the electrostatic chuck 2a is $Q_{HV}$, and the electric charge amount accumulated on the surface layer of the electrostatic chuck 2a is $Q_{SUR}$.

From the above parameters, the potential V of the electrode 21 can be calculated by the following equation (1). Although the low pass filter 111 for preventing leakage of high-frequency is actually included in the equivalent circuit of FIG. 6A, the electrostatic capacitance of the low pass filter 111 is in no consideration in the present disclosure.

[Equation 1]

$$V = \frac{(C_1 + C_2)Q_{HV} - C_1 C_2 V_{dc} + C_1 Q_{sur}}{C_0 C_1 + C_1 C_2 + C_2 C_0} \quad (1)$$

The electrostatic capacitances C1, C2, and C3 are fixed values obtained from design parameters. When the surface layer of the electrostatic chuck 2a is not charged, $Q_{SUR}$ is 0 and the third term of the equation (1) is 0. In this case, when the electrode 21 is connected to the ground, the potential V of the electrode 21 in the equation (1) shows the potential $V_0$ shown in FIG. 6B.

Figure 6B:
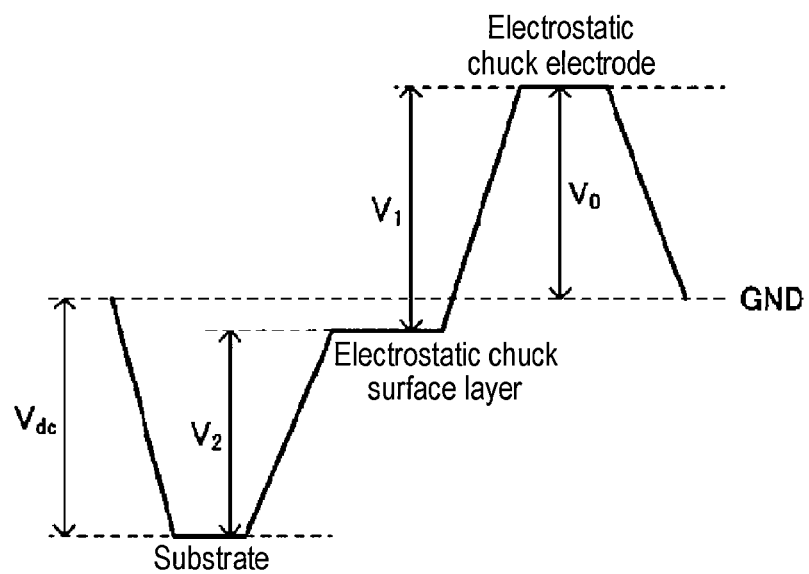

When the surface layer of the electrostatic chuck 2a is not charged, in a state where the switch 6a is opened and the electrode 21 is floating, the potential V drops from the ground by the self-bias voltage $V_{dc}$, and the potential drop value A in FIG. 4 corresponds to the self-bias voltage $V_{dc}$ shown in FIG. 6B.

When the surface layer of the electrostatic chuck 2a is charged with the electric charge amount $Q_{SUR}$, the third term of the equation (1) is not 0 in the state where the electrode 21 is connected to the ground. In this case, in the state where the electrode 21 is connected to the ground, the potential V of the electrode is a potential $V_1$ ($\neq V_0$) shown in FIG. 6B.

In addition, when the surface layer of the electrostatic chuck 2a is charged with the electric charge amount $Q_{SUR}$, the potential drop value A depends on the electric charge amount $Q_{SUR}$ in addition to the self-bias voltage $V_{dc}$ in the state where the electrode 21 is floating. The potential drop value A at this time becomes a voltage value corresponding to the self-bias voltage $V_{dc}$ and the electric charge amount $Q_{SUR}$ of the surface layer of the electrostatic chuck 2a shown in FIG. 6B.

When the surface layer of the electrostatic chuck 2a is charged in this way, the change in the potential drop value or the potential V measured at the previous time and the current time of the processing cycle of FIG. 3 corresponds to a change in the electric charge amount $Q_{SUR}$ of the surface layer of the electrostatic chuck 2a. Therefore, by acquiring the change in the potential drop value A or the potential V for each processing cycle in the measurement process (step S3 in FIG. 3), the residual electric charge amount of the surface layer of the electrostatic chuck 2a can be grasped before the substrate detachment process (step S6).

From the above, as shown in FIG. 3, a process of evaluating the residual electric charge amount of the surface layer of the electrostatic chuck 2a is inserted between the etching process (step S4) and the substrate detachment process (step S6), and the potential drop value A or the potential V for each substrate measured in the measurement process of step S3 is acquired in the evaluation process. Based on the acquired potential drop value A or potential V for each substrate, change (or change in the electric charge amount $Q_{SUR}$) is obtained and linked with the parameters of the substrate detachment process (step S6) to prevent the detachment characteristic from deteriorating. For example, by taking measures such as controlling the HV voltage applied to the electrode 21 during the elimination to an appropriate value based on the change in the potential drop value A or the change in the potential V when the electrode 21 is in the floating state, it is possible to avoid deterioration of the detachment characteristic.

[Evaluation 1]

Figure 7:
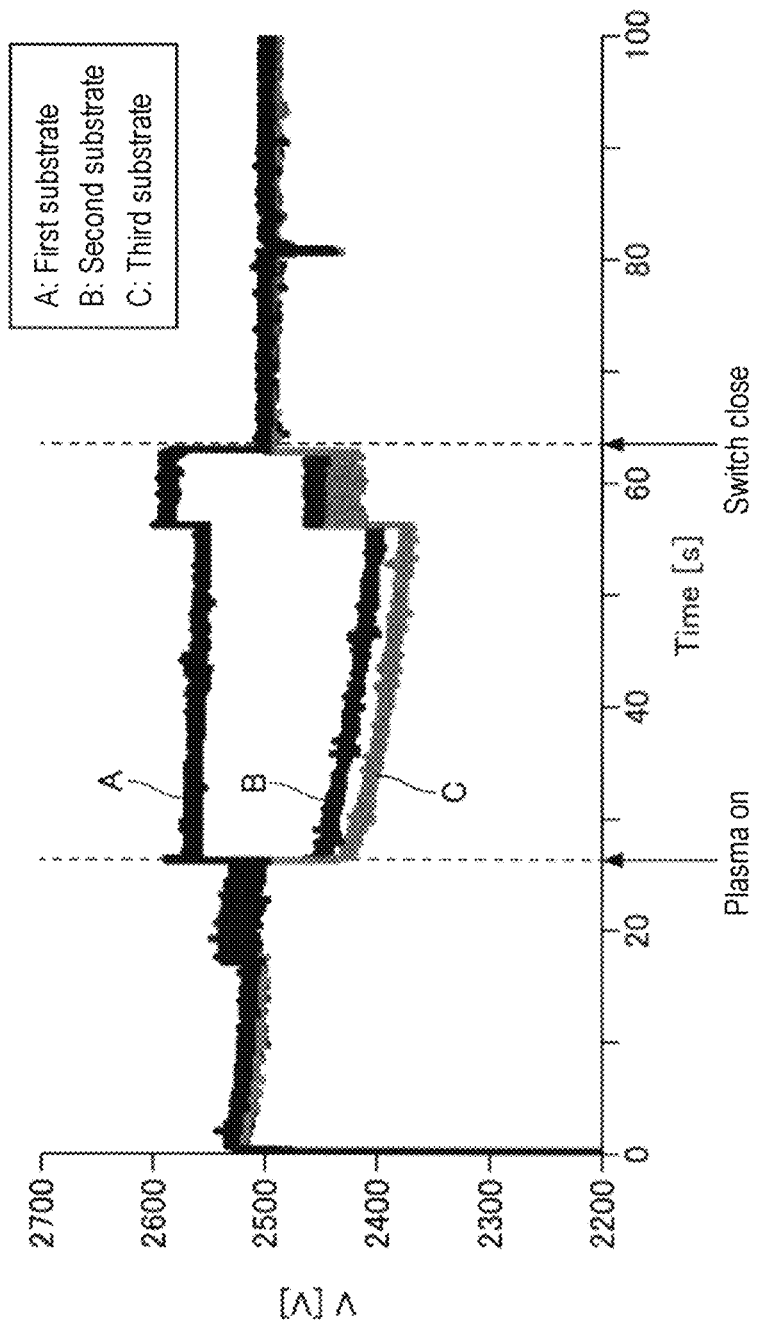
FIG. 7 is a view showing an example of a result of potential drop of the electrode potential from the ground according to an embodiment.

Next, a result of Evaluation 1 regarding the above-described measurement of the potential of the electrode (the step (d) of FIG. 4 in step S3 of FIG. 3) will be described with reference to FIG. 7. FIG. 7 is a view showing an example of a result of the potential drop of the potential V of the electrode from the ground according to the embodiment.

In an experiment of Evaluation 1, the potential V of the electrode 21 was measured in a state where no charges were supplied to the surface layer of the electrostatic chuck 2a in the processing cycle of the first substrate. The potential V of the electrode 21 was measured in the processing cycles of the second and third substrates in a state where the charges were supplied to the surface layer of the electrostatic chuck 2a by performing the wafer-less dry cleaning in step S8. The experimental conditions of Evaluation 1 are as follows.

<Experimental Conditions>

Step (a)
HV voltage: 2,500V
Step (c)
Chamber pressure: 400 mTorr (53.33 Pa)
High-frequency HF power: 400 W
Gas: $O_2$
Process time: 30 seconds Under the above experimental conditions, the substrate was irradiated with the plasma in the step (c), and the potential of the electrode was measured in the step (d). In FIG. 7, the horizontal axis represents time (s), and the vertical axis represents the electrode potential V (V). A indicates the measurement result for the first substrate, B indicates the measurement result for the second substrate, and C indicates the measurement results for the third substrate.

From the experimental results, in the processing cycles of the second and third substrates, since residual electric charges were accumulated on the surface layer of the electrostatic chuck 2a, the potential V of the electrode dropped from the ground when the plasma was turned on in the step (c) after the electrodes was set to a floating state in the step (b). Further, the potential drop of the third substrate was larger than that of the second substrate. On the other hand, at the time of processing the first substrate, since no residual electric charges were accumulated on the surface layer of the electrostatic chuck 2a, no potential drop from the ground occurred. The reason why the potential does not drop in the processing of the first substrate is that the surface layer of the electrostatic chuck 2a in the initial state is positively charged and a potential equal to or higher than the self-bias voltage $V_{dc}$ is generated. From the above results, it is found that the potential V of the electrode 21 can be measured and the electric charge amount of the surface layer of the electrostatic chuck 2a can be measured based on the change in the voltage V or the change in the potential drop value when the potential V of the electrode 21 is measured. Further, it is proved that deterioration of the detachment characteristic can be avoided by taking measures such as controlling the HV voltage applied to the electrode 21 at the time of elimination to an appropriate value based on the change in the voltage V or the change in the potential drop value.

[Evaluation 2]

Next, a result of Evaluation 2 regarding the measurement of the potential V of the electrode 21 described above will be described with reference to FIG. 8 by taking the correlation between a potential difference of the electrode and a pin torque as an example. FIG. 8 is a view showing an example of the correlation between a difference in potential drop ($\Delta V$) of the electrode potential from the ground and a pin torque according to the embodiment.

In FIG. 8, the horizontal axis represents the difference in potential drop ($\Delta V$), and the vertical axis is a torque of the lifter pins. According to this, it was found that there is a positive correlation in which a torque for detaching the substrate increases as the difference in potential drop ($\Delta V$) increases and the residual electric charge amount accumulated on the surface layer of the electrostatic chuck 2a increases. When the torque for detaching the substrate increases, the amount of current flowing on the surface of the electrostatic chuck 2a also increases. Therefore, it was found that there is a correlation between the change in potential drop ($\Delta V$), the torque of the lifter pins, and the amount of current flowing on the surface of the electrostatic chuck 2a.

[Enclosure of Plasma]

Finally, returning to FIG. 4, the step (e) will be described. The step (e) is a step of supplying a gas into the chamber C to generate plasma before the step (a) and stopping the supply of the gas before the step (b).

In the step (e), by supplying a gas into the chamber C before the step (a), electric charges can be supplied to the substrate. As a result, the electric charges can be supplied to the electrostatic chuck 2a before an HV voltage is applied to the electrode 21 in the step (a).

The electrode 21 of the electrostatic chuck 2a is classified into a unipolar type and a bipolar type. In the case of the unipolar type, since the electric charges are not supplied to the substrate side only by applying the HV voltage to the electrode 21, plasma is generated and electric charges having a polarity different from the electric charges of the electrode 21 is supplied from the plasma to enable electrostatic adsorption of the substrate. Therefore, when the electrode 21 is the unipolar type, the enclosing step (e) is an essential step. On the other hand, in the case of the bipolar type, since electric charges having different polarities can be supplied to the one electrode 21 and the other electrode 21, it is not necessary to generate plasma. When the electrode 21 is the bipolar type, the enclosing step (e) is not an essential step.

However, the first term "(C1+C2)$Q_{HV}$" in the equation (1) has a larger value as the initial charge amount is larger. When the step (e) is performed, since high-frequency power and a gas are supplied to generate plasma, the initial charge amount shown in the first term becomes large. For this reason, there is a possibility that the measurement accuracy of the potential of the electrode 21 may be improved due to the plasma enclosing of the step (e).

For example, when the plasma enclosing of the step (e) is not performed, the chamber C may be filled with a gas and an HV voltage may be applied to the electrode 21 to give electric charges to the electrostatic chuck 2a by gas adsorption. However, in this case, the charging of the electric charges is not stable in the gas adsorption due to a low adsorption force and the like, and the variation is larger than that of electric charges when the plasma is generated. Therefore, it is predicted that the measurement accuracy of the potential of the electrode 21 can be improved by the plasma enclosing of the step (e). In addition, according to the plasma enclosing of the step (e), the present disclosure provides an effect that particles can be prevented from entering between the substrate and the electrostatic chuck 2a due to the action of the plasma when electrostatically adsorbing the substrate.

Although the control method and the plasma processing apparatus have been described above with the above embodiments, the control method and the plasma processing apparatus according to the present disclosure are not limited to the above embodiments, but various modifications and improvements can be made within the scope of the present disclosure. The matters described in the aforementioned embodiments may be combined unless a conflict arises.

The substrate processing apparatus according to the present disclosure is applicable to any type of capacitively-Coupled Plasma (CCP), Inductively-Coupled Plasma (ICP), Radial Line Slot Antenna, Electron Cyclotron Resonance Plasma (ECR), Helicon Wave Plasma (HWP), and the like.

In the present disclosure, the substrate W has been described as an example of the substrate. However, the substrate is not limited thereto, but may be various substrates used for LCDs (Liquid Crystal Displays) or FPDs (Flat Panel Displays), a photo mask, a CD board, a printed board, or the like.

According to the present disclosure in some embodiments, it is possible to estimate a residual electric charge amount accumulated on a surface layer of an electrostatic chuck before a substrate is detached from the electrostatic chuck.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A control method comprising:
   (a) connecting a power supply to an electrode of an electrostatic chuck inside a chamber and applying a voltage from the power supply to the electrode;
   (b) after (a), switching a connection between the electrode and the power supply to a non-connection state;
   (c) after (b), supplying a gas into the chamber to generate plasma;
   (d) obtaining a potential drop value by measuring a potential of the electrode during (c);
   determining an HV voltage based on the potential drop value; and
   applying the HV voltage to the electrode to eliminate electric charges accumulated on a surface layer of the electrostatic chuck.

2. The control method of claim 1, wherein in (b), the electrode is connected to a member configured to measure the potential of the electrode, and
   wherein in (d), a potential of the member is measured so that the potential of the electrode is measured.

3. The control method of claim 2, further comprising: (e) supplying the gas into the chamber to generate the plasma before (a) and stopping the supply of the gas before (b).

4. The control method of claim 3, further comprising: (f) placing a substrate on a placement surface of the electrostatic chuck before (e).

5. The control method of claim 1, further comprising: (e) supplying the gas into the chamber to generate the plasma before (a) and stopping the supply of the gas before (b).

6. The control method of claim 1, further comprising:
   before (a), placing a substrate on a placement surface of the electrostatic chuck;
   after (d) and before applying the HV voltage, performing a substrate process to the substrate; and
   after applying the HV voltage, detaching the substrate from the electrostatic chuck.

7. A plasma processing apparatus comprising:
   a power supply;
   a switch configured to switch a connection between an electrode of an electrostatic chuck inside a chamber and the power supply;
   a gas source;
   a measuring device; and
   a controller configured to:
   (a) connect the power supply to the electrode and control the power supply so as to apply a voltage from the power supply to the electrode;
   (b) control the switch so as to switch the connection between the electrode and the power supply to a non-connection state after (a);
   (c) control the gas source so as to supply a gas into the chamber to generate plasma after (b);
   (d) control the measuring device so as to measure a potential of the electrode during (c) to obtain a potential drop value;
   determine an HV voltage based on the potential drop value; and
   apply the HV voltage to the electrode to eliminate electric charges accumulated on a surface layer of the electrostatic chuck.

8. The plasma processing apparatus of claim 7, wherein the controller is further configured to:
   before (a), place a substrate on a placement surface of the electrostatic chuck;
   after (d) and before applying the HV voltage, perform a substrate process to the substrate; and
   after applying the HV voltage, detach the substrate from the electrostatic chuck.

* * * * *